United States Patent [19]

Tournier

[11] Patent Number: 6,075,382
[45] Date of Patent: Jun. 13, 2000

[54] BUFFER FOR INTEGRATED CIRCUIT PADS

[75] Inventor: Christian Tournier, Seyssinet-Pariset, France

[73] Assignee: STMicroelectronics S.A., Gentilly, France

[21] Appl. No.: 09/192,022

[22] Filed: Nov. 13, 1998

[30] Foreign Application Priority Data

Nov. 26, 1997 [FR] France .................................. 97 15107

[51] Int. Cl.$^7$ ................. H03K 19/0175; H03K 19/094; H03K 17/16
[52] U.S. Cl. .............................. 326/83; 326/121; 326/36; 326/112; 326/27
[58] Field of Search ................................. 326/83, 36, 17, 326/27, 112, 119, 121

[56] References Cited

U.S. PATENT DOCUMENTS

| 4,825,099 | 4/1989 | Barton | 307/270 |
|---|---|---|---|
| 5,329,177 | 7/1994 | Nagai | 307/451 |
| 5,451,861 | 9/1995 | Giebel | 323/315 |
| 5,455,522 | 10/1995 | Jones | 326/27 |
| 5,656,960 | 8/1997 | Holzer | 327/170 |
| 5,904,618 | 6/1999 | Mattos | 326/87 |
| 5,926,056 | 7/1999 | Morris et al. | 327/333 |
| 5,929,668 | 7/1999 | Kim | 327/112 |
| 5,973,512 | 10/1999 | Baker | 326/87 |

*Primary Examiner*—Michael Tokar
*Assistant Examiner*—Daniel D. Chang
*Attorney, Agent, or Firm*—Wolf, Greenfield & Sacks, P.C.; James H. Morris; Theodore E. Galanthay

[57] ABSTRACT

The present invention relates to a buffer for logic signals including a MOS output transistor of a first conductivity type connected by its source to a first supply potential, the drain of this transistor forming an output terminal of the buffer; a control transistor for controlling the output transistor connected between the gate of the output transistor and a second supply potential; a third transistor of the first conductivity type connected between the gate of the output transistor and the first supply potential and controlled to maintain the gate-source voltage of the buffer close to a threshold voltage so that the output transistor operates as a current generator; and a fourth transistor connected to render floating the gate of the third transistor when the potential on the output terminal is close to the first supply potential.

9 Claims, 4 Drawing Sheets

BUFFER FOR INTEGRATED CIRCUIT PADS

BACKGROUND OF THE INVENTION

1. Field of the Invention

The present invention relates to a buffer, especially for an integrated circuit pad.

2. Discussion of the Related Art

An output pad of an integrated circuit is conventionally connected to a high supply potential by a P-channel MOS transistor and to a low supply potential by an N-channel MOS transistor. Both transistors are generally controlled in phase opposition without overlapping, that is, each of the transistors is turned on only if the other is effectively off. A high current surge which would occur during a time interval where both transistors are on at the same time is thus avoided.

Technologies become faster and faster, so that the signal switching edges on output pads becomes steeper and steeper.

In some applications, high frequency logic signals are desirable and these signals have steep edges.

However, in some other applications, for example, in a television set, the logic signals external to the integrated circuit have a low frequency with respect to the maximum operating frequency of the integrated circuit, and these signals have extremely steep edges which generate wide spectrum electromagnetic radiation. Such electromagnetic radiation may disturb the operation of surrounding circuits. There are even standards for limiting electromagnetic radiation emission.

It is thus desired to reduce the electromagnetic radiation emission of integrated circuits providing logic signals of relatively low frequency.

SUMMARY OF THE INVENTION

An object of the present invention is to provide an output amplifier generating electromagnetic radiation of low amplitude and narrow spectrum.

To achieve this and other objects, the present invention provides a buffer for logic signals including a MOS output transistor of a first conductivity type connected by its source to a first supply potential, the drain of this transistor forming an output terminal of the buffer; a control transistor for controlling the output transistor, connected between the gate of the output transistor and a second supply potential; a third transistor of the first conductivity type connected between the gate of the output transistor and the first supply potential and controlled to maintain the gate-source voltage of the buffer close to a threshold voltage so that the output transistor operates as a current generator; and a fourth transistor connected to render floating the gate of the third transistor when the potential on the output terminal is close to the first supply potential.

According to an embodiment of the present invention, the fourth transistor is connected between the gate of the third transistor and the gate of the output transistor and is controlled by the output terminal.

According to an embodiment of the present invention, the buffer includes a fifth transistor connected to short-circuit the control transistor when the potential on the output terminal tends towards the second supply potential.

According to an embodiment of the present invention, the buffer includes a sixth transistor connected to force the gate of the third transistor to the first supply potential after turning-off of the fourth transistor when the potential on the output terminal tends towards the first supply potential.

According to an embodiment of the present invention, the sixth transistor is of the first conductivity type and is controlled from the output of a hysteresis inverter.

According to an embodiment of the present invention, the buffer includes a seventh transistor connected to form an input transistor of a current mirror, an output transistor of which is formed by the third transistor, the fourth transistor being connected between the seventh transistor and the gate of the third transistor, and the operation as a current generator of the output transistor being obtained by a sizing of the control transistor and of the third transistor.

According to an embodiment of the present invention, the buffer includes transistors complementary to the output transistor, the control transistor, and the third, fourth, and seventh transistors, connected symmetrically to the supply potentials and to the output terminal, the seventh transistor and its complement being interconnected by a resistive load.

According to an embodiment of the present invention, the buffer includes an eighth transistor of the first conductivity type connected between the gate of the output transistor and the first supply potential and means for connecting this eighth transistor in parallel by all its terminals to the third transistor when a control signal is at an active state.

According to an embodiment of the present invention, the buffer includes means for canceling the gate-source voltage of the eighth transistor when the control signal is at an inactive state.

The foregoing objects, features, and advantages of the present invention will be discussed in detail in the following non-limiting description of specific embodiments in connection with the accompanying drawings.

DETAILED DESCRIPTION

To reduce electromagnetic radiation emission, the present invention provides a reduction of the slope of the edges of the voltage signals provided by the buffer. Of course, this means that the logic signal provided by the buffer has a sufficiently low frequency so that it is not substantially attenuated due to the reduction of the edge slopes.

Figure 1:
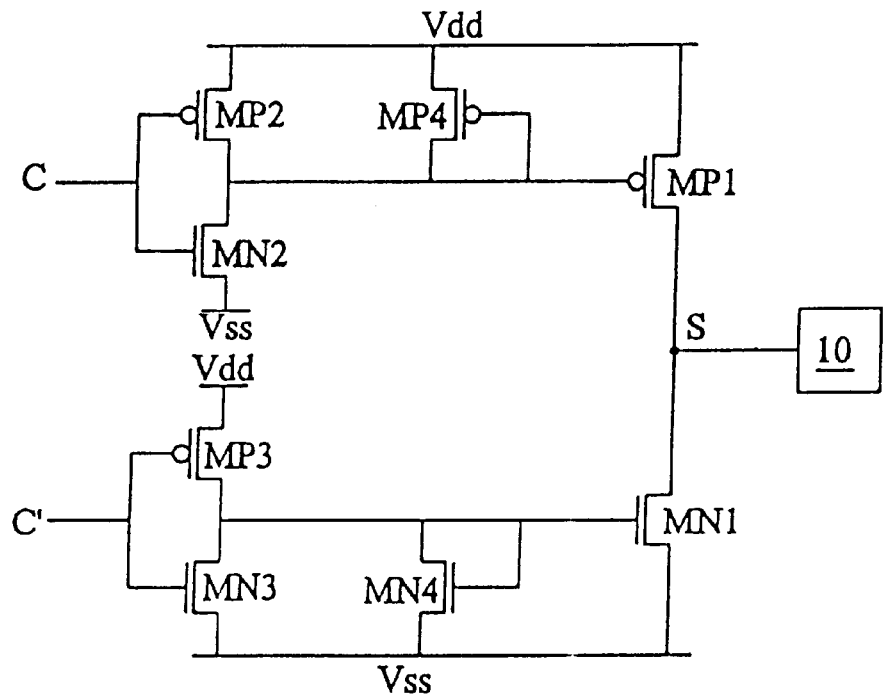
FIG. 1 partially shows a buffer forming a preliminary step in the implementation of a buffer according to the present invention.

FIG. 1 partially shows a conventional buffer modified according to a preliminary step of the present invention to reduce the slopes of the output voltage.

The buffer includes a P-channel MOS transistor MP1 and an N-channel MOS transistor MN1, the drains of which are interconnected and form the output S of the buffer. Output S is connected to an integrated circuit pad 10. The sources of transistors MP1 and MN1 are respectively connected to a high supply potential Vdd and to a low supply potential Vss.

Each of transistors MP1 and MN1 is generally controlled independently by a respective inverter. The inverter which controls transistor MP1 is formed by a P-channel MOS transistor MP2 and an N-channel MOS transistor MN2 connected in series between supply potentials Vdd and Vss. The gates of transistors MP2 and MN2 receive the same control signal C. The inverter associated with transistor MN1 is formed by a P-channel MOS transistor MP3 and of an N-channel MOS transistor MN3 connected in series between supply potentials Vdd and Vss. The gates of transistors MP3 and MN3 receive a common control signal C'.

Control signals C and C' are in the form of rectangular pulses of the same polarity, the positive pulses of signal C being narrower than the positive pulses of signal C', and included inside the positive pulses of signal C'. Transistors MP1 and MN are thus controlled so that there is no phase where these two transistors are simultaneously on.

In a conventional buffer, which does not include transistors MP4 and MN4 which will be described subsequently, the gate of each of transistors MP1 and MN1 varies practically between potentials Vss and Vdd. As a result, transistors MP1 and MN1 are controlled in resistive mode and provide currents which are only limited by their on-state resistances. Edges of maximum slope are then obtained on the output voltage.

The present invention makes each of transistors MP1 and MN1 operate as a substantially constant current generator during the output voltage edges. This is achieved by transistors MP4 and MN4. Transistor MP4 is a P-channel MOS transistor, connected as a diode between the gate of transistor MP1 and high supply potential Vdd. More specifically, the drain and the gate of transistor MP4 are connected to the gate of transistor MP1, while the source of transistor MP4 is connected to potential Vdd. Transistor MN4, which is an N-channel MOS transistor, is similarly connected between the gate of transistor MN1 and potential Vss.

With this configuration, transistors MP4, MP1, and MN4, MN1 form current mirrors. Transistor MP1 copies, in its drain, the current in transistor MP4, while transistor MN1 copies, in its drain, the current in transistor MN4. The copying of the current is performed with a multiplying coefficient which depends on the W/L (width/length) ratios of the transistors.

The current in transistor MP1 depends on supply voltage Vdd and on the on-state resistance of transistor MN2, while the current in transistor MN1 depends on supply voltage Vdd and on the on-state resistance of transistor MP3. Thus, transistors MN2 and MP3, or transistors MP4 and MN4, are sized to obtain the desired output currents. Since the load supplied by the buffer is generally capacitive, these constant output currents result in constant slopes to the output voltage.

This circuit has several disadvantages. A first disadvantage is that it has a static power consumption. At any time, at least one of transistors MP1 and MN1 is on, which means that a current is always supplied to one or the other of current mirrors MP4, MP1, and MN4, MN1. If the on-state resistances of transistors MN2 and MP3 are increased to reduce the static current, the response time of the buffer to control signals C and C' is increased. Indeed, the gate capacitances of transistors MP1 and MN1 will take longer to charge, whereby the buffer will react slower to a switching of signals C and C'.

Another disadvantage of this circuit is that its output is current limited, so that a maximum voltage excursion is not obtainable across a low value resistive load.

These disadvantages considerably limit the field of application of the circuit of FIG. 1.

Figure 2:
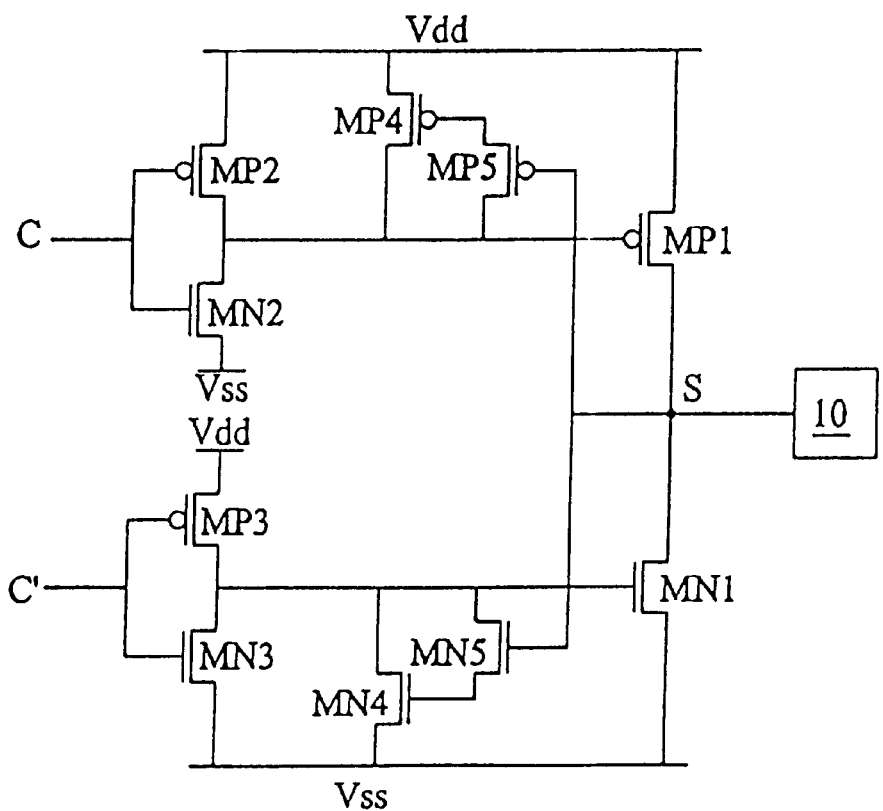
FIG. 2 shows a first embodiment of a buffer according to the present invention.

FIG. 2 shows a modification according to the present invention of the circuit of FIG. 1 overcoming most of the above-mentioned disadvantages.

The gates of transistors MP4 and MN4 are here connected to the gates of transistors MP1 and MN1 via respective MOS transistors MP5 and MN5. Transistors MP5 and MN5 are respectively a P-channel transistor and an N-channel transistor. The gates of transistors MP5 and MN5 are both connected to output S of the buffer.

To understand the operation of this circuit, it is assumed, for example, that output S is at high state Vdd, that is, signals C and C' are also at Vdd. Thus, transistor MP1 is on, which implies that transistor MN2 is also on. However, transistor MP5 is off, whereby transistor MP4 is also off and there is thus no current path between transistor MN2 and potential Vdd. Thus, transistor MN2 can draw, practically down to low potential Vss, the gate of transistor MP1 which thus operates in resistive mode and provides a maximum current on output S.

Output S being high, transistor MN5 is on, whereby transistor MN4 is connected to form a current mirror as in FIG. 1. However, transistor MP3 is off and there is no current path between transistor MN4 and potential Vdd. Transistor MN1 is off due to the fact that transistor MN3 is on and draws its gate towards potential Vss (signal C is at Vdd).

When control signals C and C' switch, transistors MN2 and MN3 turn off while transistors MP2 and MP3 turn on. Transistor MP2 draws the gate of transistor MP1 towards potential Vdd, whereby transistor MP1 turns off. Since output S remains high, transistor MN5 remains on, whereby transistors MN4 and MN1 are still connected as a current mirror. Transistor MP3 supplies current to transistor MN4, which current is copied in transistor MN1. Thus, transistor MN1 draws output S towards potential Vss at constant current, and thus with a limited slope in the general case where output S supplies a capacitive load.

When the voltage on output S is lower than the sum of the threshold voltages of transistors MN4 and MN5, transistor MN5 turns off, but transistor MN4 still operates in the same conditions, since its gate voltage is maintained for some time by capacitive effect. Thus, the current mirror effect continues as long as the gate capacitor of transistor MN4 has not discharged by leakage effect below its threshold voltage. This discharge can continue beyond the time when the voltage on output S has reached level Vss. When the gate capacitor of transistor MN4 is discharged, transistor MN4 turns off and there remains no current path between transistor MP3, which is then on, and potential Vss. Transistor MP3 draws the gate of transistor MN1 towards potential Vdd, whereby transistor MN1 starts operating in resistive mode and draws a maximum current from output S.

The level of output S then being low, transistor MP5 is on and connects transistor MP4 according to the current mirror configuration of FIG. 1. However, transistor MN2 is off and there is no current path between transistor MP4 and potential Vss.

Of course, the operation is symmetrical when output S switches from state 0 to state 1.

Since the circuit consumes no static current due to the fact that one or the other of transistors MN2 and MP3 is on, the on-state resistances of these transistors may be chosen to be relatively low to enable a fast charge of the gate capacitances of transistors MP1 and MN1 and thus a fast response to the switchings of control signals C and C'. The values of these resistances and the W/L ratios of transistors MN1, MN4, MP1, and MP4 may be adjusted to set both the output current desired during the switchings and the response time.

To obtain a maximum response speed, it is actually sufficient that the charge current of the gates of transistors MP1 and MN1 is maximum during the charge time of the gates of these transistors up to their threshold voltage. Beyond this duration, this maximum current is useless and causes a high switching current consumption.

Figure 3:
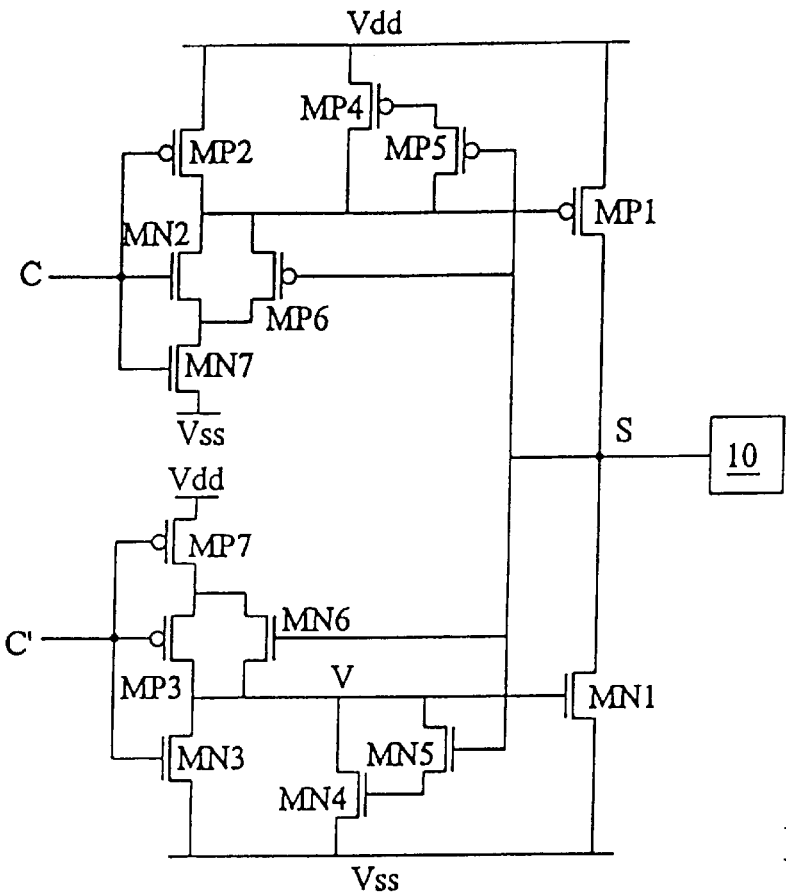
FIG. 3 shows a second embodiment which is a first improvement of the buffer of FIG. 2.

FIG. 3 shows a modification according to the present invention of the circuit of FIG. 2 enabling to obtain a fast response of the buffer to be obtained while limiting its switching consumption. In this embodiment, a P-channel MOS transistor MP6 is connected in parallel to transistor MN2, and an N-channel MOS transistor MN6 is connected in parallel to transistor MP3. The gates of transistors MP6 and MN6 are connected to output S of the buffer. Further, an N-channel MOS transistor MN7 is connected between potential Vss and transistor MN2 and a P-channel MOS transistor MP7 is connected between potential Vdd and transistor MP3.

Transistors MP6, MN7, MN6, and MP7 are sized to have a low on-state resistance since they will have to ensure a fast charge of the gate capacitances of transistors MP1 and MN1 to decrease the buffer response time. Transistors MN2 and MP3 are sized independently from transistors MP6, MN7, MN6, and MP7, to set the current of transistors MP1 and MN1 during switching.

Figure 4:
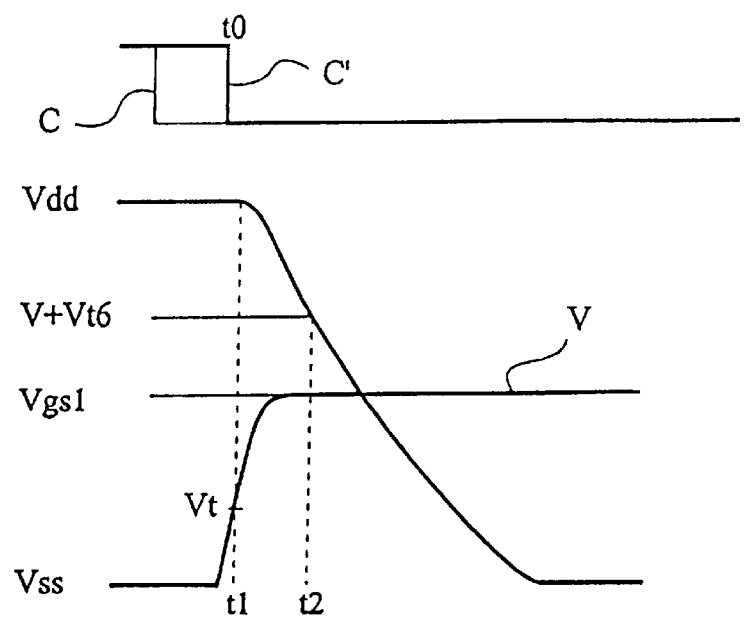
FIG. 4 shows the variations of signals of the buffer of FIG. 3, illustrating its operation.

FIG. 4 shows the variations of several signals to illustrate the operation of the circuit of FIG. 3. FIG. 4 shows in particular the variations of voltage S at the buffer output terminal and of voltage V on the gate of transistor MN1, in the example where control signals C and C' switch from state 1 to state 0.

Initially, signals C and C' are at 1, whereby output S is at 1 (Vdd). Transistor MN6 thus short-circuits transistor MP3 which is not on for the time being.

Before a time t0, signal C switches to state 0 to turn off transistor MP1 before transistor MN1 is turned on.

At time t0, signal C' switches to state 0. Then, transistors MP7 and MP3 turn on and transistor MN3 turns off. Transistor MP3 still is short-circuited by transistor MN6, whereby the gate of transistor MN1, which was drawn towards low potential Vss by transistor MN3, is charged by a high current determined by the low on-state resistance of transistors MP7 and MN6. Thus, voltage V increases rapidly.

At a time t1, voltage V reaches threshold voltage Vt of transistors MN1 and MN4. Transistors MN1 and MN4 then start operating as a current mirror and transistor MN1 turns on. But gate voltage V of transistor MN1 must reach a value Vgs1 so that this transistor effectively copies the high current imposed by transistors MP7 and MN6. Voltage S starts decreasing from time t1 and reaches a maximum slope when voltage V reaches value Vgs1.

At a time t2, voltage S reaches the value of voltage V increased by threshold voltage Vt6 of transistor MN6. From this time on, transistor MN6 is off. Then, the current in transistor MN4, copied in transistor MN1, depends on the series resistances of transistors MP7 and MP3. The resistance of transistor MP3 is high with respect to that of transistor MN6, whereby the output current decreases and the slope of voltage S becomes low from time t2, as desired. In reality, the described switchings are progressive, which results, as shown, in an output signal S having a slope which varies progressively.

The resistance of transistor MP3 can be chosen to be particularly high to decrease the current consumption from time t2 without this altering the response speed. Indeed, the response speed is determined by the high current briefly flowing between times t0 and t2. The slope of voltage S is set to the desired value by adequately choosing the W/L ratios of transistors MN1 and MN4.

As previously, when voltage S falls under the sum of the threshold voltages of transistors MN4 and MN5, transistor MN5 turns off, but transistor MN4 maintains its behavior for the time required by its gate capacitance to discharge. This will generally enable voltage S to reach value Vss while keeping the same slope, as shown.

Of course, the operation is symmetrical when control signals C and C' switch from state 0 to state 1.

A disadvantage of the circuits of FIGS. 2 and 3 is that the discharge of the gate capacitance of transistor MN4 cannot be controlled when transistor MN5 is off. It is not desirable to maintain the gate charge of transistor MN4 long after the time when signal S reaches low value Vss, since this would result in the flowing of a static current through transistors MP3 and MN4. This phenomenon is enhanced in a noisy environment, where noise peaks can from time to time turn transistor MN4 on since its gate voltage is in the vicinity of the conduction threshold.

The same problems arise for transistor MP4 in the complementary state of the buffer.

Figure 5:
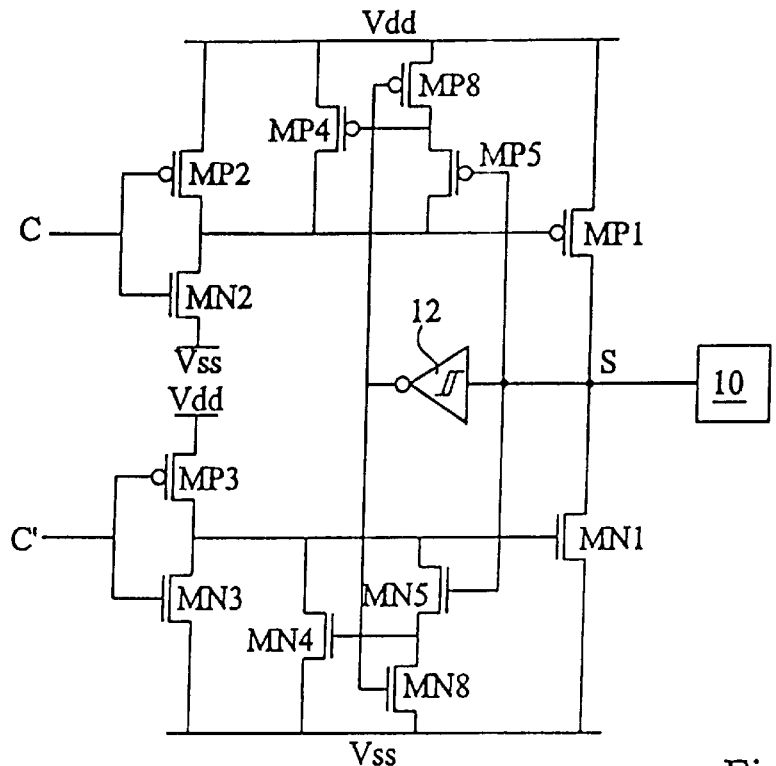
FIG. 5 shows a third embodiment which is a second improvement of the buffer of FIG. 2.

FIG. 5 shows a modification according to the present invention of the circuit of FIG. 2 overcoming these disadvantages.

The gate of transistor MP4 is connected to potential Vdd by a P-channel MOS transistor MP8, while the gate of transistor MN4 is connected to potential Vss by an N-channel MOS transistor MN8. The gates of transistors MP8 and MN8 are controlled by a hysteresis inverter 12, the input of which is connected to output S of the buffer. Hysteresis inverter 12 is designed to switch high when its input voltage S drops under a threshold comprised between 0 (Vss) and the sum of the threshold voltages of transistors MN4 and MN5. Of course, inverter 12 operates symmetrically and switches low when its input voltage S exceeds a threshold comprised between potential Vdd and potential Vdd minus the sum of the threshold voltages of transistors MP4 and MP5.

Thus, if output S is, for example, initially at 1, the output of inverter 12 is at 0 and turns off transistor MN8. The initial conditions described as an example in relation with FIG. 2 thus reappear. When signals C and C' switch, transistor MP3 turns on and supplies transistor MN4 with a current which is copied in transistor MN1. Output voltage S then progressively decreases. When voltage S reaches the sum of the threshold voltages of transistors MN4 and MN5, transistor MN5 turns off, but the behavior of transistor MN4 is maintained due to the fact that its gate voltage is stored by capacitive effect. Voltage S still decreases progressively and ends up reaching the switching threshold of inverter 12. Then, inverter 12 turns on transistor MN8 which discharges the gate capacitance of transistor MN4 and turns off this latter transistor. Transistor MP3 then increases the gate voltage of transistor MN1 which reaches its resistive operation mode in the vicinity of the time when voltage S reaches value Vss.

Of course, a symmetrical operation is obtained when voltage S switches from the low state to the high state.

Figure 6:
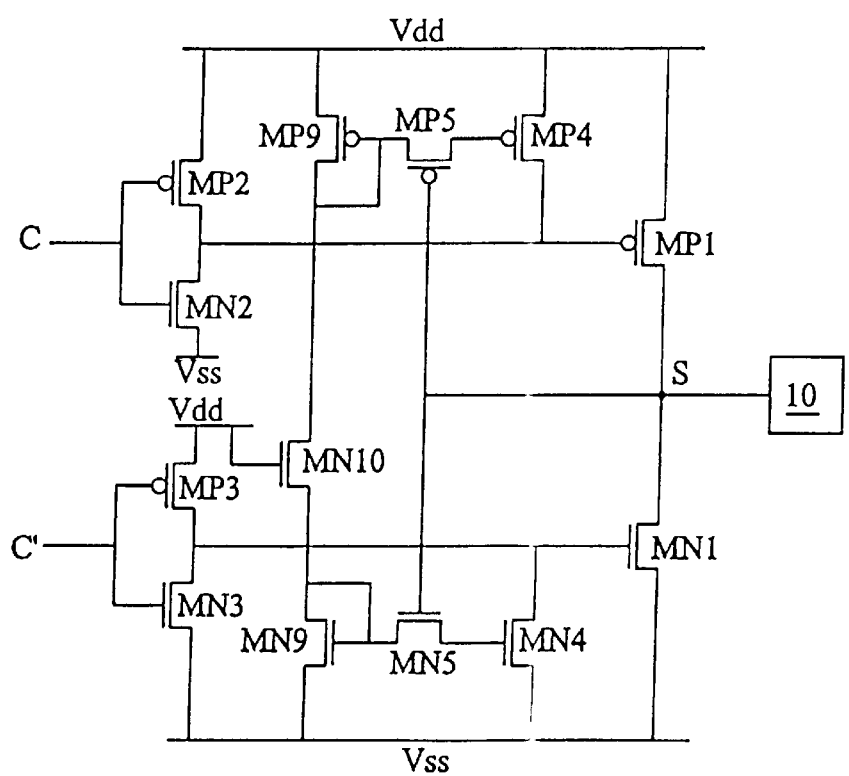
FIG. 6 shows a fourth embodiment of a buffer according to the present invention.

FIG. 6 shows an embodiment of a buffer according to the present invention enabling a relatively accurate matching of the rising slopes and of the falling slopes of the buffer output voltage. Transistor MP5, instead of being connected to potential Vdd, is connected to the gate of a diode-connected P-channel MOS transistor MP9. Similarly, transistor MN5, instead of being connected to potential Vss, is connected to the gate of a diode-connected N-channel MOS transistor MN9. The sources of transistors MP9 and MN9 are respectively connected to potentials Vdd and Vss. The drains of transistors MP9 and MN9 are interconnected via an N-channel MOS transistor MN10. The gate of transistor MN10 is connected to high potential Vdd, so that transistor MN10 operates in resistive mode. The identical current flowing in transistors MP9 and MN9 is determined by transistors MN9, MP9, and MN10, and by supply voltage Vdd. The W/L ratios of transistors MP4, MP1, and MN4, MN1, enable the accurate setting of the rising and falling slopes.

When output S is in high state Vdd, transistor MN5 turns on so that transistors MN9 and MN4 behave as a current mirror, with transistor MN4 copying on its drain the current of transistor MN9. When control signals C and C' switch, transistor MP3 turns on and tends to increase the gate voltage of transistor MN1. The dimensions of transistors MP3 and MN4 are chosen for the gate voltage of transistor MN1 to be substantially equal to the gate or drain voltage of transistor MN9, so that transistor MN1 also copies the current of transistor MN9. The operation described in relation with FIG. 2 is then obtained.

A symmetrical operation is obtained when output S switches from low state Vss to high state Vdd, transistor MP1 copying the current of transistor MP9, which is identical to the current of transistor MN9.

The circuit of FIG. 6 has the disadvantage of having a static consumption. This static consumption can however be reduced to a minimum by modifying the W/L ratios of transistors MP4, MP9, and MN4, MN9, the currents of transistors MP4 and MN4 being amplified without increasing the response delay of the buffer.

Of course, the embodiments of FIGS. 3, 5, and 6 may be combined.

Figure 7:
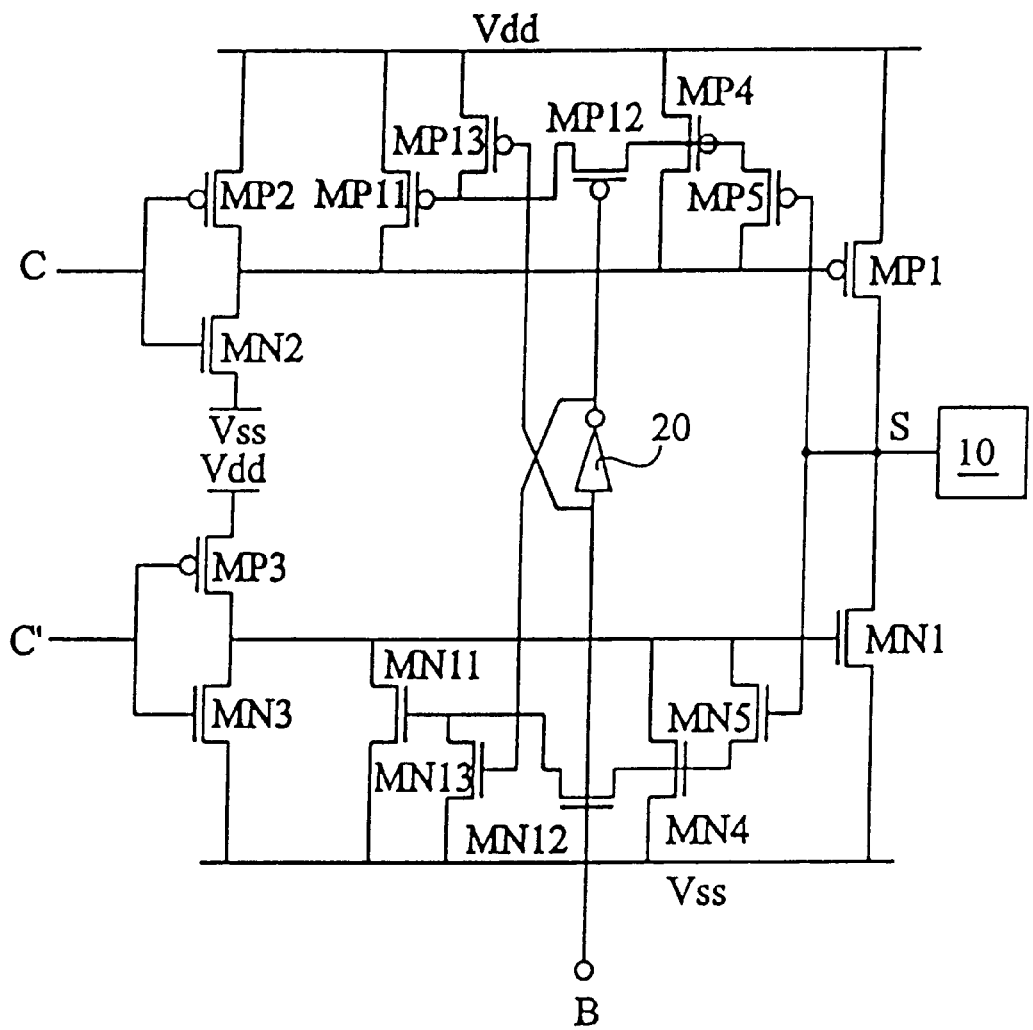
FIG. 7 shows an alternative of the embodiment of FIG. 2 enabling the slope of the output signal of the buffer to be chosen from among several values.

FIG. 7 shows an alternative of the circuit of FIG. 2 enabling the slope of output signal S of the buffer to be chosen from among several possible values (two values in the example of FIG. 7). A P-channel MOS transistor MP11 is connected, like transistor MP4, between the gate of transistor MP1 and supply line Vdd. Similarly, an N-channel MOS transistor MN11 is connected like transistor MN4 between the gate of transistor MN1 and supply line Vss. The gate of transistor MP11 is connected to the gate of transistor MP4 via a P-channel MOS transistor MP12. Similarly, the gate of transistor MN1 is connected to the gate of transistor MN4 via an N-channel MOS transistor MN12. A logic control signal B is applied on the gate of transistor MN12. This same signal B is applied on the gate of transistor MP12 via an inverter 20.

With this configuration, when signal B is set to 1, transistors MN12 and MP12 turn on and connect transistors MP11 and MN11, in parallel, respectively, on transistors MP4 and MN4. As a result, the current copying factor in transistors MP1 and MN1 decreases by an amount depending on the W/L ratios of transistors MP4, MP11, MN4, and MN11.

Several other transistors can be connected to transistors MP4 and MN4 like transistors MP11 and MN11, these other transistors being controlled by other signals corresponding, with signal B, to the bits of a digital control signal. The slope of the output signal can thus be accurately set.

To avoid the floating of the gates of transistors MP11 and MN11 when transistors MP12 and MN12 are off, a P-channel MOS transistor MP13 connected between the gate of transistor MP11 and potential Vdd is provided, as well as an N-channel MOS transistor MN13 connected between the gate of transistor MN11 and potential Vss. Transistor MP13 is controlled by signal B while transistor MN13 is controlled by the output of inverter 20. Thus, when transistors MP12 and MN12 are off, transistors MP13 and MN13 are on and cancel the gate-source voltages of transistors MP11 and MN1.

Of course, the present invention is likely to have various alterations, modifications, and improvements which will readily occur to those skilled in the art. For example, transistors MP5 and MN5 can be replaced with transistors of inverse conductivity type and may be controlled by an inverter.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A buffer for logic signals including:
   a MOS output transistor of a first conductivity type connected by its source to a first supply potential, a drain of this transistor forming an output terminal of the buffer;
   a control transistor for controlling the output transistor, connected between the gate of the output transistor and a second supply potential;
   a first transistor of the first conductivity type connected between the gate of the output transistor and the first supply potential and controlled to maintain the gate-source voltage of the output transistor close to a threshold voltage so that the output transistor operates as a current generator; and
   a second transistor connected to render floating the gate of the first transistor when the potential on the output terminal is close to the first supply potential.

2. The buffer of claim 1, wherein the second transistor is connected between the gate of the first transistor and the gate of the output transistor and is controlled by the output terminal.

3. The buffer of claim 1, including a third transistor connected to short-circuit the control transistor when the potential on the output terminal tends towards the second supply potential.

4. The buffer of claim 1, including a third transistor connected to force the gate of the first transistor to the first supply potential after turning-off of the second transistor when the potential on the output terminal tends towards the first supply potential.

5. The buffer of claim 4, wherein the third transistor is of the first conductivity type and is controlled from the output of a hysteresis inverter.

6. The buffer of claim 1, including a third transistor connected to form an input transistor of a current mirror, an output transistor of which is formed by the first transistor, the second transistor being connected between the third transistor and the gate of the first transistor, and the operation as a current generator of the output transistor being obtained by a sizing of the control transistor and of the first transistor.

7. The buffer of claim 6, including transistors complementary to the output transistor, the control transistor, and the first, second, and third transistors, connected symmetrically to the supply potentials and to the output terminal, the third transistor and its complement being interconnected by a resistive load.

8. The buffer of claim 1, including an third transistor of the first conductivity type connected between the gate of the output transistor and the first supply potential and means for connecting this third transistor in parallel by all its terminals to the first transistor when a control signal is at an active state.

9. The buffer of claim 8, including means for canceling the gate-source voltage of the third transistor when the control signal is at an inactive state.

* * * * *